(12) United States Patent (10) Patent No.: US 7,663,857 B2
Enomoto et al. (45) Date of Patent: Feb. 16, 2010

(54) LOAD DRIVER CIRCUIT AND IGNITION DEVICE USING THE SAME

(75) Inventors: Mitsuyasu Enomoto, Anjo (JP); Kouji Andoh, Motosu (JP)

(73) Assignee: Denso Corporation, Kariya (JP)

( * ) Notice: Subject to any disclaimer, the term of this patent is extended or adjusted under 35 U.S.C. 154(b) by 123 days.

(21) Appl. No.: 11/960,075

(22) Filed: Dec. 19, 2007

(65) Prior Publication Data

US 2008/0151448 A1   Jun. 26, 2008

(30) Foreign Application Priority Data

Dec. 21, 2006   (JP) .............................. 2006-344347

(51) Int. Cl.
*H01H 47/00* (2006.01)
(52) U.S. Cl. ...................................... 361/139
(58) Field of Classification Search .................. 361/56, 361/57, 139
See application file for complete search history.

(56) References Cited

U.S. PATENT DOCUMENTS 5,173,755 A * 12/1992 Co et al. ..................... 257/361

6,278,328 B1 * 8/2001 Yamamoto et al. .......... 330/298

FOREIGN PATENT DOCUMENTS

| JP | 2004-335979 | * 12/2003 |
| JP | 2004-335979 |   11/2004 |

* cited by examiner

*Primary Examiner*—Stephen W Jackson
*Assistant Examiner*—Angela Brooks
(74) *Attorney, Agent, or Firm*—Nixon & Vanderhye P.C.

(57) ABSTRACT

A protection circuit can be prevented from malfunctioning due to the parasitic operation attributable to the unstable base potential of a transistor. In one embodiment, the protection circuit can be constituted by a reverse transistor system where the bases of transistors are connected to the collectors so that bases and collector potentials are the same. With the above configuration, the base potential is stabilized, and even if a parasitic potential is applied to the base as noise, malfunction associated with transistors turn on due to parasitic operation can be prevented. Since the base potential is stabilized, the protection circuit transistors turn on with greater certainty when a surge current occurs such that the surge current is absorbed by the protection circuit and flows to GND.

2 Claims, 5 Drawing Sheets

LOAD DRIVER CIRCUIT AND IGNITION DEVICE USING THE SAME

CROSS REFERENCE TO RELATED APPLICATIONS

The present invention is based on and claims priority to Unpublished Japanese Patent Application No. 2006-344347 filed on Dec. 21, 2006, the contents of which are incorporated herein by reference.

BACKGROUND OF THE INVENTION

1. Field of the Invention

The present invention relates to a load driver circuit suitable for an ignition device in an internal combustion engine. More specifically, the present invention relates to a load driver circuit having a control circuit that controls the on/off cycling of a semiconductor switch element, and a protection circuit for protecting the control circuit from a surge current.

2. Description of Related Art

Electric parts that are mounted in an automobile are required to provide both reliability and resistance against severe environments and accompanying electrical anomalies such as surge currents. Up to now, in order to address anomalies such as surge currents, the control circuit and the protection circuit are disposed on the same substrate in the ignition device for an internal combustion engine.

For example, JP-A 2004-335979 describes a semiconductor substrate having a control circuit and a protection circuit. The protection circuit includes plural protection elements having the same wiring length, the same wiring width, and the same wiring resistance. The protection elements are connected in parallel to each other to form the protection circuit. The protection circuit also includes an npn transistor whose base is open.

Figure 8:
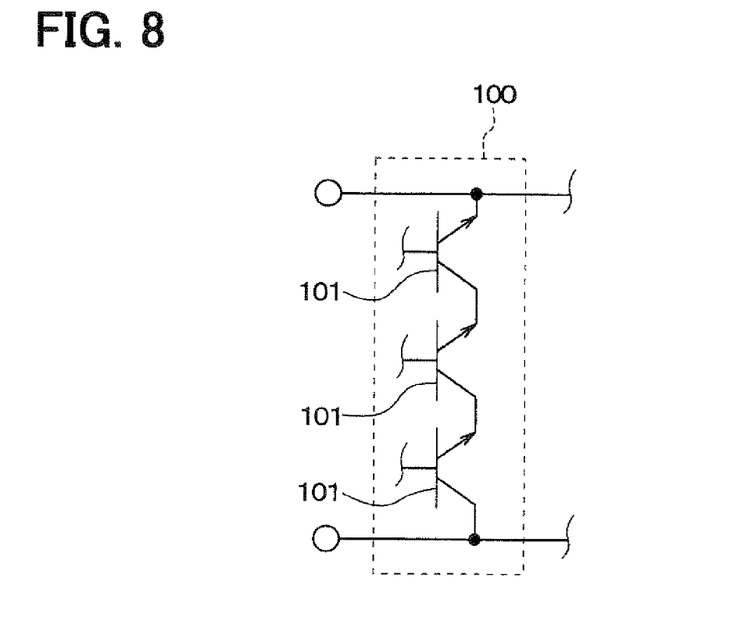
FIG. 8 is a schematic diagram illustrating a conventional protection circuit using an open base npn transistor configuration.

FIG. 8 is a circuit diagram showing a conventional protection circuit 100 formed of plural npn transistors 101, the bases of which are open. The plural transistors form a reverse transistor system in which the emitter sides have a relatively higher potential, the collector sides have a relatively lower potential, and the bases are open. In the above circuit configuration, when a voltage across the npn transistor 101 in an opposite direction such as between the emitter and the base, is greater than or equal to a withstand voltage, for example, 24V, due to breakdown of the npn transistor 101, the surge current escapes to GND.

However, since the bases of the npn surge protection transistors 101 are open, the base potential can become unstable. For example, when a potential is applied to the bases in the form of noise, npn transistors 101 can be turned on in parasitic operation resulting in a risk of malfunction.

Also, because of the open base configuration, the current amplification factor (Hfe) must be reduced, for example, by lowering the impurity concentration of an emitter layer as compared with the impurity concentration of a base diffusion layer. However such lowering of the impurity concentration can cause the dynamic resistance to become high, thereby making it difficult for the npn transistor 101 to absorb the surge current when needed.

SUMMARY OF THE INVENTION

The present invention has been made in view of the above disadvantages, and thus a first object of the present invention is to prevent the protection circuit from malfunctioning due to parasitic operation attributable to the unstable potential of the transistor base.

A second object of the present invention is to prevent inhibiting the absorption of the surge current due to a higher dynamic resistance of the transistor.

In order to achieve the above and other objects, according to a first aspect of the invention, an exemplary protection circuit can be disposed between an input terminal and a ground terminal. The protection circuit is constituted by a reverse transistor system that includes a single or plural transistors each having an emitter connected to an input terminal side and a collector connected to a ground terminal. Each of the transistors has a base electrically connected to the collector, the base having the same potential as that of the collector.

As described above, the base of each transistor is electrically connected to the collector so that the base has the same potential as that of the collector. As compared with the conventional open base configuration, in accordance with the configuration of the invention, the potential of the base is stabilized. Accordingly, even if the a parasitic potential is applied to base in the form of noise, malfunction of the transistors, which can be turned on due to the parasitic operation, can be prevented. Also, since the base potential is stabilized, the transistors of the protection circuit can be made to turn on with greater certainty when a surge current occurs. As a result, the surge current can be successfully absorbed by the protection circuit and can be made to flow to GND.

In the load driver circuit as described above, the transistors can include, for example: a collector layer constituting the collectors and formed on a substrate, the collector layer of a first conductivity type; plural base layers of a second conductivity type constituting the bases, the plural base layers arranged in a stripe shape in a direction perpendicular to a longitudinal direction within the collector layer; and plural emitter layers of the first conductivity type constituting the emitters, the plural emitter layers arranged in a stripe shape in a direction perpendicular to a longitudinal direction of the base layer, the plural emitter layers formed within the plural base layers.

The transistors further include plural emitter wiring patterns respectively connected to the plural emitter layers; plural base wiring patterns respectively connected to the plural base layers; plural collector wiring patterns connected to portions of the collector layer adjacent to the plural base layers; a first common wiring that joins the plural emitter wiring patterns together; and a second common wiring that joins the plural base wiring patterns and the plural collector wiring patterns together. The first common wiring and the second common wiring are preferably symmetrically disposed at both ends of the plural base layers and the plural emitter layers in the longitudinal direction across the plural base layers and the plural emitter layers. The plural base wiring patterns and the plural collector wiring patterns extend along the longitudinal direction of the plural base layers or the collector layer that is adjacent to the plural base layers to project the plural base wiring patterns and the plural collector wiring patterns from the first common wiring in a comb shape. Also, the plural emitter wiring patterns preferably extend along the longitudinal direction of the plural emitter layers and are connected to the second common wiring to project the plural emitter wiring patterns from the second common wiring in the comb shape.

According to the above configuration, when the transistors turn on, the current path has a uniform length, regardless of whether it extends from the collector wiring patterns to the emitter wiring patterns through the collector layers or the emitter layers through any location. Accordingly, the entire protection circuit has a uniform wiring resistance.

According to the second aspect of the present invention, the protection circuit includes a transistor disposed between the input terminal and the ground terminal, and a driver circuit having a zener diode and a resistor connected in series between the input terminal and the ground terminal. The base of the transistor is connected to a connection point of the zener diode and the resistor.

In the above configuration, when the surge current occurs, because the voltage exceeds the withstand voltage of the diode, a current flows between the diode and the resistor, a potential difference occurs between the base and the collector of the transistor due to a voltage drop at the resistor. As a result, a base current flows into the transistor, and the transistor turns on. Accordingly, because the surge current is allowed to flow as the collector current of the transistor, the surge current can be absorbed by the protection circuit and can flow to GND. Also, with the above configuration in accordance with the invention, the current amplification factor Hfe can be increased as compared with the conventional open base configuration. Because the impurity concentration of the emitter layer does not need to be lower than the impurity concentration of the base layer, it is possible to decrease the dynamic resistance of the transistor, and the surge current can be more easily absorbed.

In the load driver circuit thus configured, the transistor can have the same configuration as the above first aspect of the present invention. In such a case, first common wiring and second common wiring are symmetrically disposed at both ends of the plurality of base layers and the plurality of emitter layers in the longitudinal direction across the plurality of base layers and the plurality of emitter layers. The plurality of collector wiring patterns extend along the longitudinal direction of the collector layer that is adjacent to the plurality of base layers and is connected to the first common wiring to project the plurality of collector wiring patterns from the first common wiring in, for example, a comb shape. The plurality of emitter wiring patterns extend along the longitudinal direction of the plurality of emitter layers and are connected to the second common wiring to project the plurality of emitter wiring patterns from the second common wiring in the comb shape. Preferably, the base wiring patterns are so arranged as to thread through gaps between the emitter wiring patterns and the first common wiring and gaps between the collector wiring patterns and the second common wiring.

According to the above configuration, when the transistor turns on the current paths have a uniform length regardless of whether a current path extends from the collector wiring patterns to the emitter wiring patterns through the collector layer or the emitter layers passes through any location. For that reason, the entire protection circuit can have the uniform wiring resistance. The load driver circuit configured as described above is preferably applied to an ignition device for controlling a coil current that flows in an ignition coil, for example, with the ignition coil as a load.

BRIEF DESCRIPTION OF THE DRAWINGS

Other objects, features and characteristics of the present invention will be appreciated and become apparent to those of ordinary skill in the art and all of which form a part of the present application. In the drawings:

FIG. 4 is a diagram illustrating an exemplary current path when the transistor is turned on;

DETAILED DESCRIPTION OF EXEMPLARY EMBODIMENTS

Hereinafter, a description will be given of exemplary embodiments of the present invention with reference to the accompanying drawings. In the following respective embodiments, the same or equivalent parts are indicated by identical symbols in the drawings.

First Embodiment

A description will be given of an ignition device 1 including a load driver circuit according to an embodiment of the present invention with reference, for example, to FIG. 1.

The ignition device 1 is used to ignite a plug 50, such as a spark plug, in an internal combustion engine for a vehicle. The ignition device 1 includes a switch IC 2 that constitutes a switch portion and a control circuit IC 3 that constitutes a control circuit portion. The switch IC 2 and the control circuit IC 3 can be formed of, for example, separate chips. The switch IC 2 controls the energization of a primary winding 4a in an ignition coil 4, such as through controlling switching. The switch IC 2 includes an IGBT 5 and a resistor 6.

The IGBT 5 is used for conducting switched control of the energization of the primary winding 4a in the ignition coil 4. More specifically, the collector terminal of the IGBT 5 is connected with a primary winding 4a of the ignition coil 4 acting as a load, and the emitter terminal of the IGBT 5 is connected with GND. A control signal in the form of a gate voltage is input to the gate of the IGBT 5 from the control circuit IC 3 through an input resistor 6 to conduct on/off control of the IGBT 5.

A control circuit IC 3 includes a protection circuit 7 and a control circuit 8. The control circuit IC 3 receives an ignition signal that is transmitted from an engine ECU 9 through an input terminal 3a and applies a control signal to the switch IC 2 and thereby to the IGBT 5. More specifically, the protection circuit 7 is disposed between the input terminal 3a and a GND terminal 3b, and protects the control circuit 8 from a surge current, for example, on the input side thereof. The control circuit 8 adjusts the control signal output to the switch IC 2 and the IGBT 5 on the basis of, for example, a coil current that flows in the primary winding 4a of the ignition coil 4 and a temperature of the switch IC 2.

In the present embodiment, the protection circuit 7 is provided with a reverse transistor system in which the emitter side is at a higher potential and the collector side is at a lower potential. Plural transistors 10, 11, and 12 are connected in series to constitute the protection circuit 7. The base and the collector of the respective transistors 10 to 12 are electrically connected to each other, thereby fixing the potential of the base to the potential of the collector.

Figure 2:
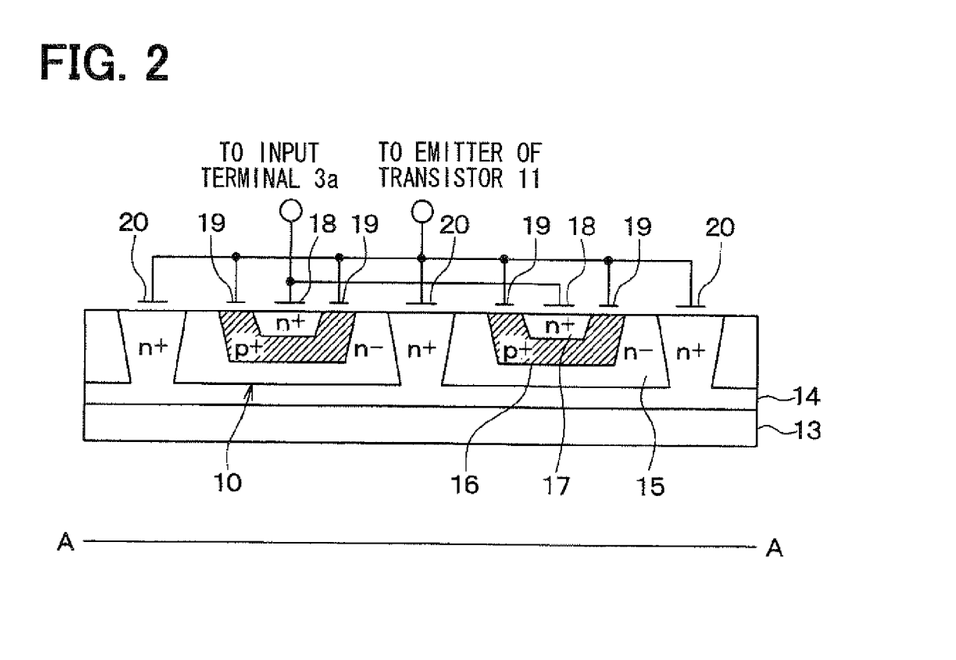
FIG. 2 is a diagram illustrating a cross-sectional view A-A and showing the structure of and connections to an exemplary transistor protection circuit.
Figure 3:
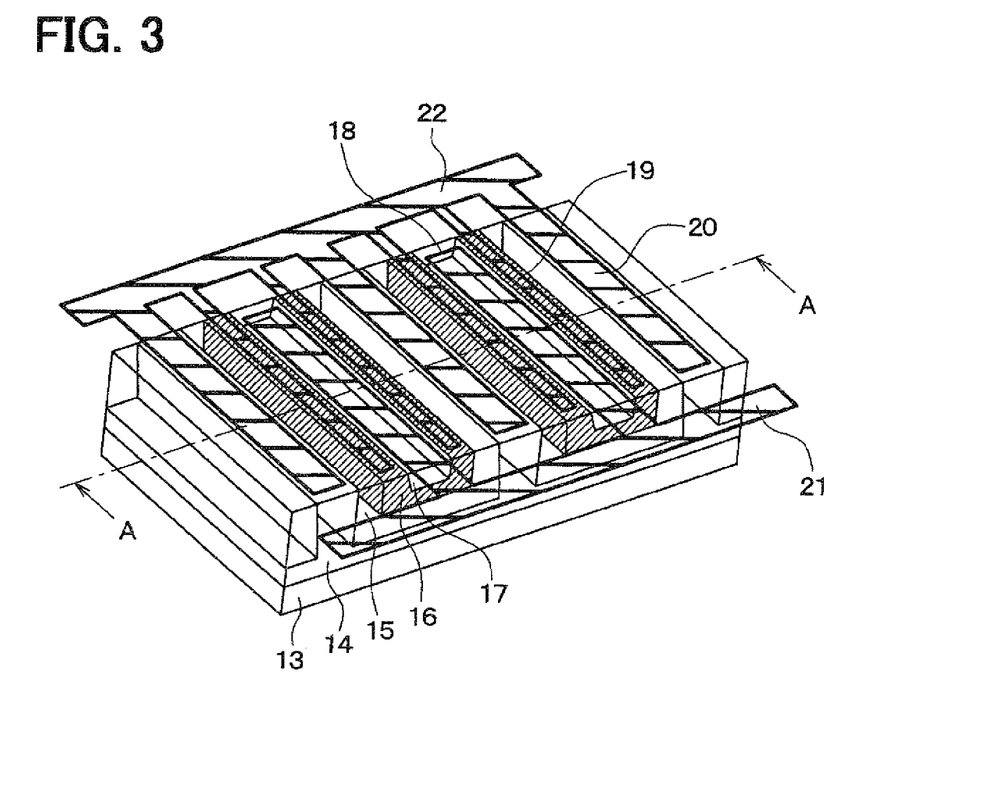
FIG. 3 is a perspective diagram illustrating an exemplary structure and layout of the transistor protection circuit shown in cross section in FIG. 2.

A more detailed view of exemplary ones of transistors 10 to 12 is shown in FIG. 2, which shows a cross-sectional view of structure of an exemplary transistor that constitutes the protection circuit 7. The connection state of the respective portions of, for example, the transistor 10 and the wiring patterns are also shown. FIG. 3 is a perspective transparent diagram showing the structure and layout of the transistor 10 and it should be noted that FIG. 2 corresponds to a cross section taken along the section line A-A shown in FIG. 3. It should also be noted that in the present example, while the transistor 10 is exemplified, the transistors 11 and 12 can also have the same structure. Further, while transistors 10 to 12 are formed on the same semiconductor substrate, they can be electrically isolated from each other by a known element separation structure.

As shown in FIG. 2, an n$^+$ type collector layer 14 is formed on the surface of a p type semiconductor substrate 13 that is formed of, for example, a silicon substrate, and an n$^-$ type well layer 15 is formed in a given region on a front layer portion of the n$^+$ type collector layer 14. As shown in FIG. 3, the plural n$^-$ type well layers 15 are arranged in a stripe or a strip shape. That is, the plural n$^-$ type well layers 15 are arranged along one direction of the semiconductor substrate 13, while the longitudinal direction of the respective n$^-$ type well layers 15 is perpendicular to the arrangement direction. The widths in the arrangement direction, the lengths in the longitudinal direction, and the depths of the respective n-type well layers 15 are equal to each. For that reason, the configuration at both ends of the respective n-type well layers 15 in the longitudinal direction are essentially the same.

P$^+$ type base layers 16 are formed in the interior of the respective n$^-$ type well layers 15 and are shallower in the junction depth than the n$^-$ type well layers 15. As shown in the cross section of FIG. 2, the respective p$^+$ type base layers 16 are formed along the center lines of the respective n$^-$ type well layers 15. Since the lengths of the respective p$^+$ type base layers 16 are uniform and equal to the lengths of the n$^-$ type well layers 15, the distances between the termination positions of the respective p$^+$ type base layers 16 and the termination positions of the respective n$^-$ type well layers 15 on the substrate surface coincide. That is, the lengths of the respective p$^+$ type base layers 16 in the longitudinal direction are equal to and coincide with the lengths of the respective n$^+$ type well layers 15 in the longitudinal direction, and positions at both ends of the respective p$^+$ type base layers 16 in the longitudinal direction coincide with positions at both ends of the respective n$^-$ type well layers 15 in the longitudinal direction.

In the interior of each of the respective p$^+$ type base layers 16, are respective n$^+$ type emitter layers 17 that are shallower in the junction depth direction than the p$^+$ type base layers 16. As shown in FIG. 2 and in FIG. 3, the respective n$^+$ type emitter layers 17 are formed along the center lines of the respective n$^+$ type base layers 16. The lengths of the respective n$^+$ emitter layers 17 are uniform and equal to and coincide with the lengths of the n$^+$ type base layers 16 and the n$^-$ type well layers 15, so that distances between the termination positions of the respective n$^+$ type emitter layers 17 and the termination positions of the respective p$^+$ type base layer 16 and the n$^-$ type well layers 15 on the substrate surface are equal. That is, the lengths of the respective n$^+$ emitter layers 17 in the longitudinal direction are equal to and coincide with the lengths of the respective p$^+$ type base layers 16 and the n$^-$ type well layers 15 in the longitudinal direction, and positions at both ends of the respective n$^+$ type emitter layers 17 in the longitudinal direction coincide with positions at both ends of the respective p$^+$ type base layers 16 and the n$^-$ type well layers 15 in the longitudinal direction.

When the transistor 10 is thus configured, the respective n$^+$ type emitter layers 17 are connected to the input terminal 3a through emitter wiring patterns 18 or in connection with a common wiring portion 21 that will be described in greater detail hereinafter. The respective p$^+$ type base layers 16 and the n$^+$ type collector layer 14 are connected to the n$^+$ type emitter layer side of the transistor 11 through base wiring patterns 19, collector wiring patterns 20, and common wiring portions 22 that will also be described in greater detail hereinafter. Also, although FIG. 2 and FIG. 3 is directed for illustrative purposes to transistor 10, is should be understood that the above descript also applies to transistors 11 and 12. That is, both of the p$^+$ type base layer and the n$^+$ type collector layer of the transistor 11 are connected to the n$^+$ type emitter layer of the transistor 12 through the base wiring patterns and the collector wiring patterns. Both of the p$^+$ type base layer and the n$^+$ type collector layer of the transistor 12 are connected to the GND terminal 3b through the base wiring patterns and the collector wiring patterns. That is, the p$^+$ type base layers 16 of the respective transistors 10 have the same potential as that of the n$^+$ type collector layers 14.

More specifically, as shown in FIG. 3, the emitter wiring patterns 18 are brought into contact with the surfaces of the respective n$^+$ type emitter layers 17 through contact holes that are defined in an interlayer insulating film (not shown), and extend along the longitudinal direction of the respective n$^+$ type emitter layers 17 to the ends thereof. On the common connection side, the emitter wiring patterns 18 extend beyond ends of the respective n$^+$ type emitter layers 17, and are connected to each other through the common wiring portion 22. That is, the emitter wiring patterns 18 are so configured as to project from the common wiring portion 22 in a comb shape. All of the widths of the emitter wiring patterns 18 that constitute the respective comb teeth are uniform.

On the other side, the base wiring patterns 19 and the collector wiring patterns 20 are brought in contact with the surface of the respective p$^+$ type base layers 16, or the respective n$^+$ type collector layers 14 that are adjacent to the respective p$^+$ type base layers 16. The base wiring patterns 19 and the collector wiring patterns 20 extend along the respective p$^+$ type base layers 16 and the respective n$^+$ type collector layers 14 that are adjacent to the respective p$^+$ type base layers 16 to which they are connected to the respective terminal ends thereof. On the common connection end, the base wiring patterns 19 and the collector wiring patterns 20 extend beyond the ends of the respective p$^+$ type base layers 16 and are connected to each other by the common wiring portion 22, for example on the side opposite of the common wiring portion 21 that connects the emitter wiring patterns 18. That is, the base wiring patterns 19 and the collector wiring patterns 20 are so configured as to project from the common wiring portion 22 in a comb shape. The widths of each of the respective wiring patterns which constitute the respective comb teeth are uniform. However, for example, while the widths of the base wiring patterns 19 are uniform and the widths of the collector wiring patterns 20 are uniform, the width of the base wiring patterns 19 may differ from the width of the collector wiring patterns 20 or may be the same width.

The respective wiring patterns 18 to 20 face each other so that the base wiring patterns 19 are interposed between the emitter wiring patterns 18 and the collector wiring patterns 20. Also, the respective common wiring portions 21 and 22 that are connected with the emitter wiring patterns 18 and the collector wiring patterns 20, respectively, are also symmetrically arranged across the respective n+ type collector layers 14 and the respective n+ type emitter layers 17.

In the ignition device 1 thus configured, an ignition signal from the engine ECU 9 is transmitted to the switch IC 2 through the control circuit IC 3 to control the on/off operation of the IGBT 5. The collector terminal of the IGBT 5 is connected with the primary winding 4a of the ignition coil 4, and the secondary winding 4b of the ignition coil 4 is connected to the plug 50. As a result, the on/off operation of the IGBT 5 is controlled so as to control the discharge timing of the plug 50 by the ignition device 1.

The protection circuit 7 is constituted by the reverse transistor system, and the bases of the respective transistors 10 to 12 are connected to the collectors thereof so that the potential of the bases can be fixed to the potential of the collectors. Accordingly, as compared with the open base configuration of the conventional art, the base potential is stabilized, and even if a parasitic potential is applied to the base as noise, it is possible to prevent parasitic operation of the transistors, such as turn on, and associated malfunction of the ignition device 1. Also, since the base potential is stabilized, the transistors 10 to 12 turn on with greater certainty when the surge current occurs. As a result, it is possible that the surge current is absorbed by the protection circuit 7 and flows in the GND.

Also, in the present embodiment, the respective p+ type base layers 16 and the respective n+ type emitter layers 17 are arranged in a stripe shape within the n+ type collector layer 14. The emitter wiring patterns 18, ends of each of which are connected on one side of the exemplary structure to a common wiring portion 21 and the collector wiring patterns 20, ends of each of which are connected on another side of the exemplary structure to a common wiring portion 22 thereby face each other. The respective common wiring portions 21 and 22 that are connected with the emitter wiring patterns 18 and the collector wiring patterns 20, respectively are symmetrically arranged across the n+ type collector layer 14 and the n+ type emitter layers 17. For that reason, as can be understood from the schematic diagram showing the current path, which is shown as an arrow in FIG. 4, when the transistors 10 to 12 are turned on, regardless of which path is taken by current that flows from the collector wiring patterns 20 to the emitter wiring patterns 18, such as through the n+ collector layer 14 or the n+ emitter layers 17, the current paths have the uniform length. Accordingly, the entire protection circuit 7 can have a uniform wiring resistance and the likelihood or possibility of destruction due to a surge current of one or more current carrying elements of the protection circuit 7 can be reduced or eliminated.

Figure 4:
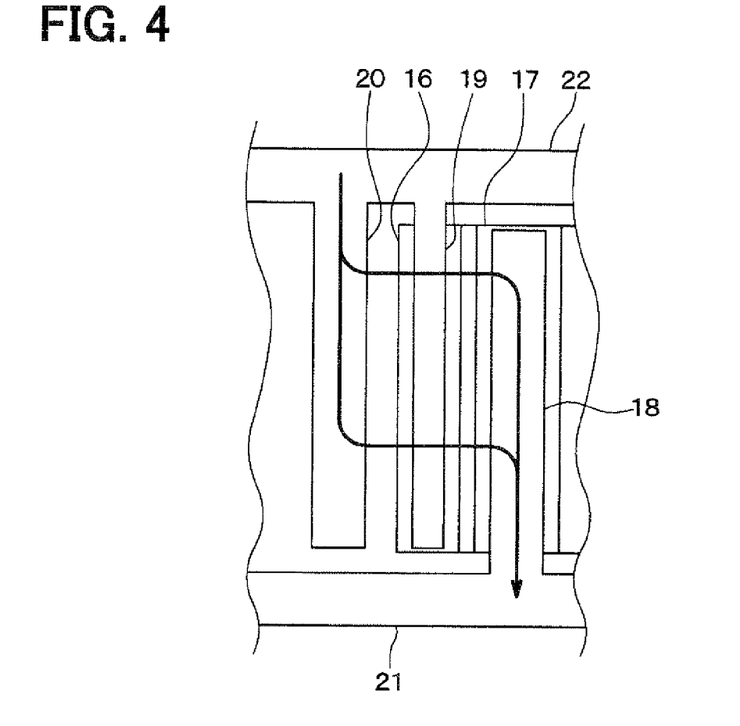

Further, in the present embodiment, when the transistor 10 turns on, the surge current flows only in a region where the n+ collector layer 14 and the n+ emitter layers 17 face each other. That is, no surge current flows at both ends of the p+ type base layers 16 and the n+ emitter layers 17 where the electric field is liable to be concentrated. For that reason, it is possible to protect the element from being destroyed due to the concentrated electric field.

Second Embodiment

A second embodiment of the present invention will be described below. The ignition device 1 according to the second embodiment, the configuration of the protection circuit 7 within the control circuit IC 3 can be modified relative to the first embodiment. However, other portions of the exemplary configuration are identical with those in the first embodiment. Accordingly, for simplicity, in the following description, portions of the second embodiment that are different from those of the first embodiment will be discussed and described.

Figure 5:
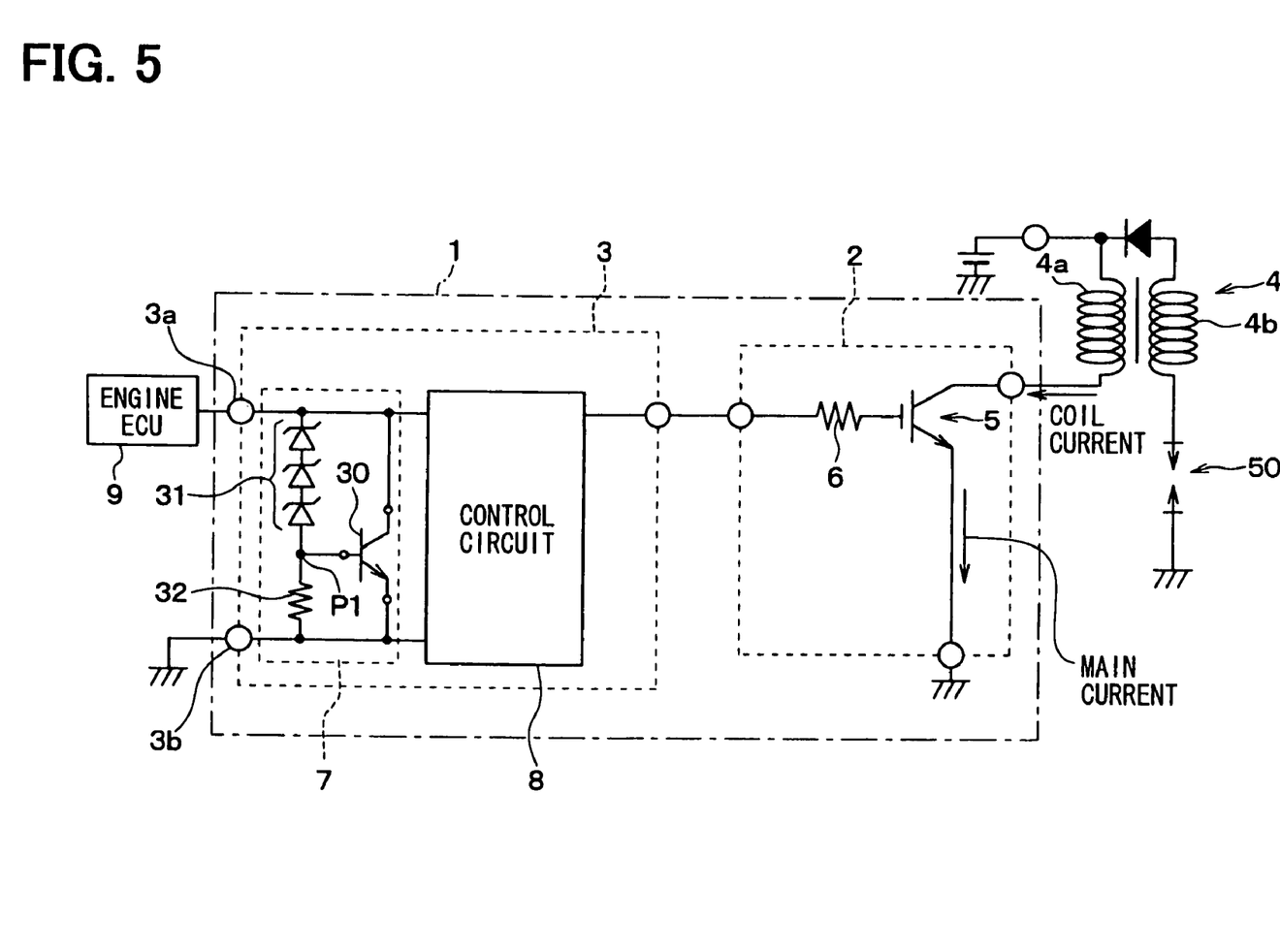
FIG. 5 is a schematic diagram illustrating an exemplary ignition device according to a second embodiment of the invention.

As shown in FIG. 5, the protection circuit 7 has an npn transistor 30, plural zener diodes 31, and a resistor 32. The npn transistor 30 has a collector connected to the input terminal 3a, and an emitter connected to the GND terminal 3b. The plural zener diodes 31 and the resistor 32 constitute a driver circuit for driving the npn transistor 30, and are connected in series between the input terminal 3a and the GND terminal 3b. A connection point P1 between the plural zener diodes 31 and the resistor 32 is connected to the base of the npn transistor 30.

Figure 6:
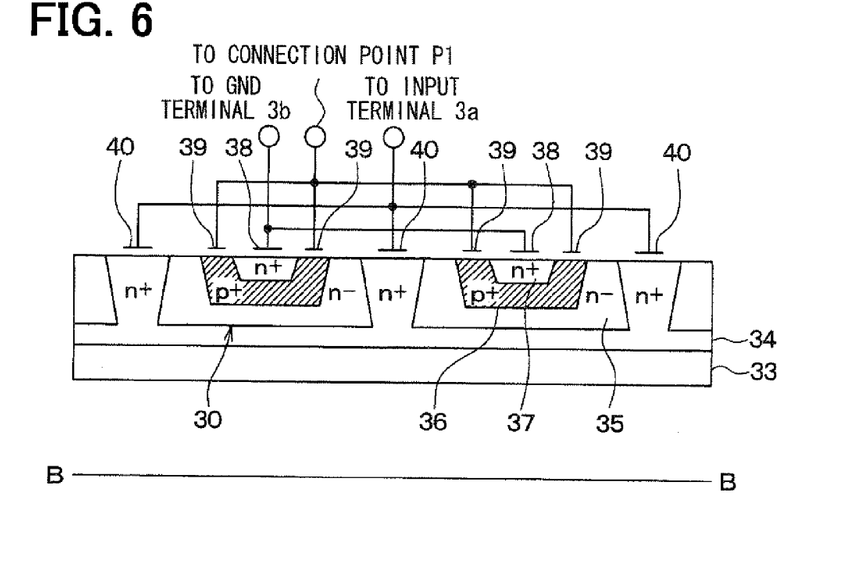
FIG. 6 is a diagram illustrating a cross-sectional view B-B and showing the structure of and connections to an exemplary transistor protection circuit.
Figure 7:
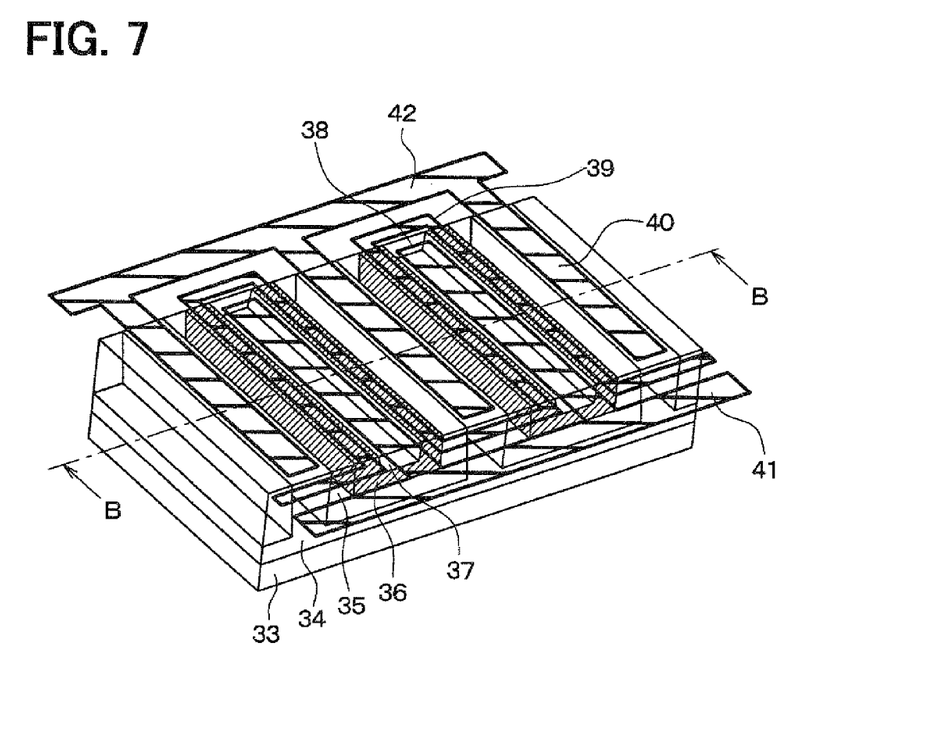
FIG. 7 is a perspective diagram illustrating an exemplary structure and layout of the transistor protection circuit shown in cross section in FIG. 6.

FIG. 6 shows the cross sectional structure of the transistor 30 that constitutes the protection circuit 7 within the control circuit IC 3 and a connection state between the respective portions of the transistor 30 and the wiring patterns. FIG. 7 is a perspective diagram transparently showing the structure and layout of the transistor 30. FIG. 6 corresponds to a section B-B in FIG. 7.

As shown in FIG. 6, a portion that constitute the element portion of the sectional structure of the transistor 30, that is, a semiconductor substrate 33, an n+ type collector layer 34, n− type well layers 35, p+ type base layers 36, and n+ type emitter layers 37 are the essentially the same in the sectional structure with the semiconductor substrate 13, the n+ type collector layer 14, the n− type well layers 15, the p+ type base layers 16, and the n+ type emitter layers 17, which constitute the element portion of the transistor 10 shown in FIG. 2. However, as shown in FIG. 6, in the transistor 30, the n+ type emitter layers 37 are connected to the GND terminal 3b through emitter wiring patterns 38, the p+ type base layers 36 are connected to the connection point P1 through the base wiring pattern 39, and the n+ type collector layer 34 is connected to the input terminal 3a through collector wiring patterns 40.

More specifically, as shown in FIG. 7, the emitter wiring patterns 38 are arranged like the emitter wiring patterns 18 in the first embodiment. The emitter wiring patterns 38 extend along the longitudinal direction of the respective n+ type emitter layers 37 to the ends thereof on one end, go beyond one ends of the respective n+ type emitter layers 37 on the other end, and are connected to each other by a common wiring portion 41 on the other end.

On the other hand, the collector wiring patterns 40 are arranged like the collector wiring patterns 20 in the first embodiment. The collector wiring patterns 40 extend along the longitudinal direction of the respective n+ type collector layers 34 that are adjacent to the respective p+ type base layers 36, go beyond another ends of the respective n+ type base layers 16 (opposite side of the common wiring portion 41 in the emitter wiring patterns 38), and are connected to each other by a common wiring portion 42.

The base wiring patterns 39 extend along the longitudinal direction of the respective p+ type base layer 16. The base wiring patterns 39 are connected to each other so as to thread through gaps between the emitter wiring patterns 38 and the common wiring 41 and gaps between the collector wiring patterns 40 and the common wiring 42. With the above configuration, the emitter wiring patterns 38 and the collector wiring patterns 40 face each other in a state where the base wiring patterns 39 are interposed between the emitter wiring patterns 38 and the collector wiring patterns 40.

In the ignition device 1 configured as described above, the protection circuit 7 is made up of the npn transistor 30, the zener diode 31, and the resistor 32. In accordance with the above configuration, when a surge current occurs, the voltage developed by the surge exceeds the withstand voltage of the zener diode 31. A current flows between the zener diode 31 and the resistor 32 and a potential difference develops between the base and the collector of the npn transistor 30 due to a voltage drop at the resistor 32. As a result, a base current flows in the npn transistor 30, and the npn transistor 30 turns on. Accordingly, because the surge current is allowed to flow as the collector current of the npn transistor 30, the surge current is absorbed by the protection circuit 7 to flow in GND.

Also, in the above configuration, it is possible to increase the current magnification factor Hfe as compared with the case where the base is opened as in the conventional art. That is, because it is unnecessary that the impurity concentration of the $n^+$ type emitter layers 37 is made lower than the impurity concentration of the $p^+$ type base layers 36, it is possible to reduce the dynamic resistance of the npn transistor 30. As a result, the surge current can be more easily absorbed.

In accordance with the present embodiment, the $p^+$ type base layers 36 and the $n^+$ type emitter layers 37 are arranged in a stripe shape within the $n^+$ type collector layer 34. The emitter wiring patterns 38 and the collector wiring patterns 40 also face each other. Also, the respective common wiring portions 41 and 42 that are connected with the emitter wiring pattern 38 and the collector wiring patterns 40, respectively, are also symmetrically arranged across the $n^+$ type collector layers 34 and the $n^+$ type emitter layers 37. For that reason, as in the first embodiment, when the npn transistor 30 turns on, regardless of the path of the current that flows from the collector wiring patterns 40 to the emitter wiring patterns 38 through the $n^+$ collector layer 34 or the $n^+$ emitter layers 37 passes, the current paths have a uniform length. For that reason, the entire protection circuit 7 can be provided with a uniform wiring resistance.

Other Embodiments

In the above first and second embodiments, the switch IC 2 and the control circuit IC 3 are formed of separate chips as parts that constitute the switch portion and the control circuit portion. However, the separate chips may not be always provided.

Figure 1:
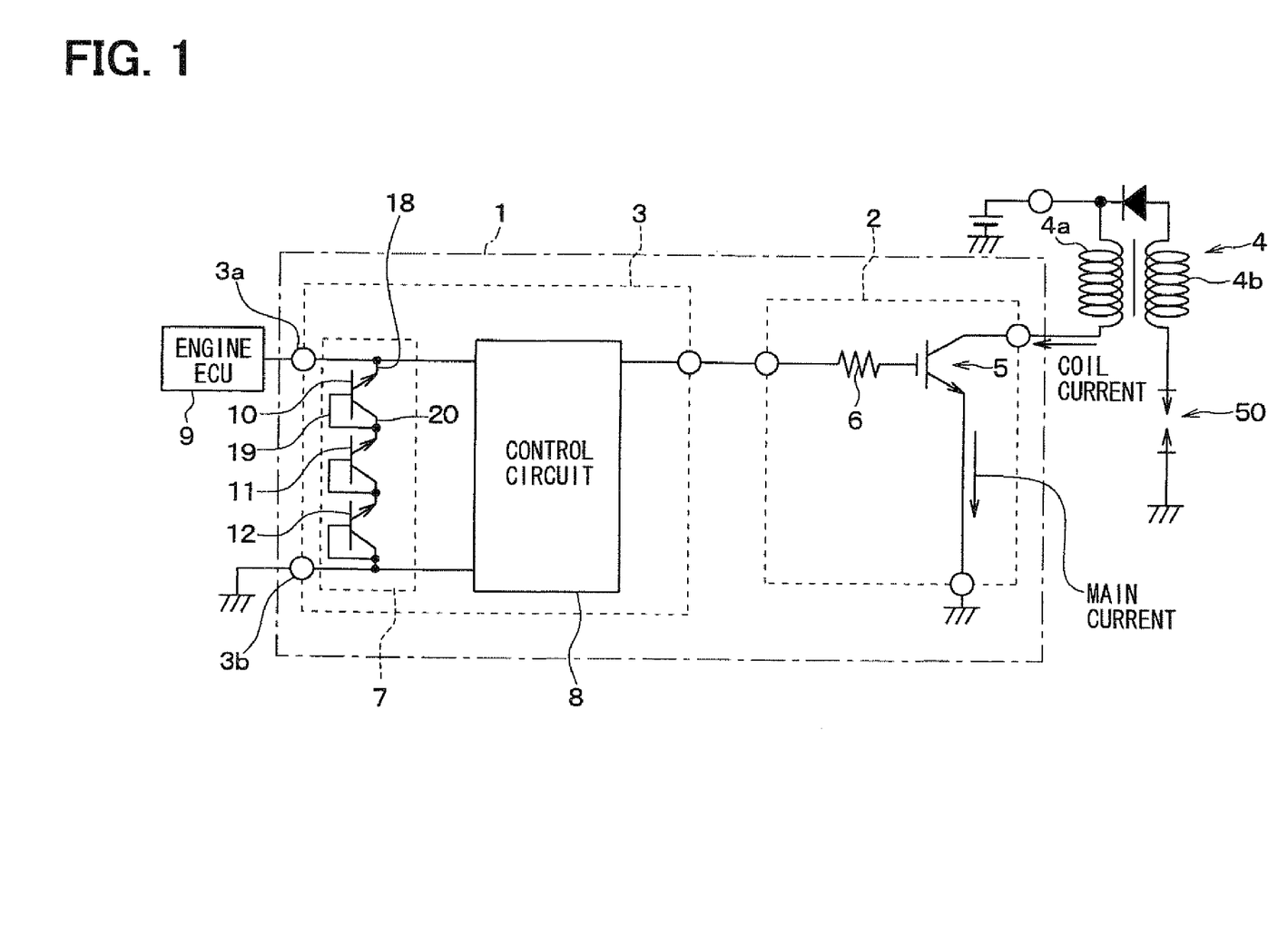
FIG. 1 is a schematic diagram illustrating an ignition device according to a first exemplary embodiment of the invention.

It should be noted that in accordance with the first and second embodiments, for example, as shown as described herein in connection with FIG. 1 and FIG. 4, an exemplary number of transistors 10 to 12 and an exemplary number of zener diodes 31 is included. However, the particular number is for illustrative purposes. It will therefore be appreciated that the number of transistors 10 to 12 and the number of zener diodes 31 can be appropriately changed according to, for example, the required withstand voltage for the particular application of the protection circuit 7. Also, while an exemplary sectional structure of the transistors 10 to 12 and the npn transistor 30 is shown, other sectional structures are possible and are contemplated as being with the scope of the invention. Further, while in the above described embodiments, the transistors 10 to 12 and the npn transistor 30 are exemplified as npn conductivity types, the conductivity types of the impurity layers can be reversed, for example, to pnp.

What is claimed is:

1. A load driver circuit controlling a current that flows in a load, the load driver circuit comprising:
a switch portion including a semiconductor switching element that controls the current; and
a control circuit portion having an input terminal, a ground terminal, a control circuit that outputs a control signal driving the semiconductor switching element on the basis of a drive signal input from the input terminal, and a protection circuit for protecting the control circuit from a surge current,
wherein the protection circuit is disposed between the input terminal and the ground terminal, the protection circuit constituted by a reverse transistor system including one or more transistors each having an emitter connected to the input terminal side and a collector connected to the ground terminal, each of the one or more transistors having a base electrically connected to the collector such that the base and the collector have the same potential,
wherein the one or more transistors include:
a collector layer of a first conductivity type formed on a substrate, the collector layer constituting one or more collectors associated respectively with the one or more transistors;
one or more base layers of a second conductivity type arranged side by side in a longitudinal direction, the one or more base layers having a stripe shape, the one or more base layers constituting one or more bases associated respectively with the one or more transistors; and
one or more emitter layers of the first conductivity type arranged side by side in the longitudinal direction, the one or more emitter layers having a stripe shape, the one or more emitter layers constituting one or more emitters associated respectively with the one or more transistors, the one or more emitter layers formed within the one or more base layers, and
wherein the one or more transistors further includes:
one or more emitter wiring patterns connected respectively to the one or more emitter layers;
one or more base wiring patterns connected to the plural base layers, respectively;
one or more collector wiring patterns connected to portions of the collector layer which are adjacent to the one or more base layers;
a first common wiring connecting the one or more emitter wiring patterns together; and
a second common wiring connecting the one or more base wiring patterns and the one or more of collector wiring patterns together,
wherein the first common wiring and the second common wiring are symmetrically disposed at both ends of the one or more base layers and the one or more emitter layers in the longitudinal direction across the one or more base layers and the one or more emitter layers,
wherein the one or more emitter wiring patterns extend from the first common wiring along a direction perpendicular to the longitudinal direction and project from the first common wiring in a comb shape having spaces, and
wherein the one or more of base wiring patterns and the one or more collector wiring patterns extend from the second common wiring along the direction perpendicular to the longitudinal direction from an opposite side and project from the first common wiring in the comb shape into the spaces.

2. A load driver circuit for controlling a current flowing in a load, the load driver circuit comprising:
a switch portion in which a semiconductor switching element that controls the current is formed; and
a control circuit portion having an input terminal, a ground terminal, a control circuit that outputs a control signal for driving the semiconductor switching element on the basis of a drive signal input from the input terminal, and a protection circuit for protecting the control circuit from a surge current, wherein the protection circuit includes a transistor disposed between the input terminal and the ground terminal, and a driver circuit having a zener diode and a resistor connected in series between the input terminal and the ground terminal, a base of the transistor connected to a connection point of the zener diode and the resistors, wherein the transistor includes:

a collector layer of a first conductivity type formed on a substrate the collector layer constituting a collector of the transistor;

a base layer of a second conductivity type arranged in a direction perpendicular to a longitudinal direction of the substrate, the base layer constituting the base of the transistor; and an emitter layer of the first conductivity type arranged in the direction perpendicular to the longitudinal direction, the emitter layer constituting an emitter of the transistor, the emitter layer formed within the base layer, and wherein the transistor further includes:

an emitter wiring pattern connected to the emitter layer;

a base wiring pattern connected to the base layer;

a collector wiring pattern connected to portions of the collector layer that are adjacent to the base layer;

a first common wiring that joins the emitter wiring pattern; and a second common wiring that loins the collector wiring pattern together, wherein the first common wiring and the second common wiring are symmetrically disposed on opposite sides of the substrate and on opposite ends of the base layer, the emitter layer and the collector layer and extend in the longitudinal direction, wherein the emitter wiring pattern is connected to the first common wiring and extends along the perpendicular direction, the emitter wiring pattern projecting from the first common wiring in a comb shape having spaces, and wherein the collector wiring pattern is connected to the second common wiring and extends alone the perpendicular direction, the collector wiring pattern projecting from the second common wiring in a comb shape into the spaces, wherein the base wiring pattern is arranged so as to thread through gaps formed in the spaces between the emitter wiring pattern, the first common wiring, the collector wiring pattern and the second common wiring.

* * * * *